United States Patent
Zarkesh-Ha et al.

(10) Patent No.: US 8,042,076 B2
(45) Date of Patent: Oct. 18, 2011

(54) SYSTEM AND METHOD FOR ROUTING CONNECTIONS WITH IMPROVED INTERCONNECT THICKNESS

(75) Inventors: Payman Zarkesh-Ha, Albuquerque, NM (US); Christopher L. Hamlin, Los Gatos, CA (US); Ashok K. Kapoor, Palo Alto, CA (US); James S. Koford, Monterey, CA (US); Madhukar B. Vora, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 743 days.

(21) Appl. No.: 12/115,991

(22) Filed: May 6, 2008

(65) Prior Publication Data

US 2009/0282382 A1 Nov. 12, 2009

(51) Int. Cl.
*G06F 17/50* (2006.01)
(52) U.S. Cl. ........... 716/104; 716/55; 716/126; 716/132
(58) Field of Classification Search ............... 716/55, 716/104, 126, 321
See application file for complete search history.

(56) References Cited

U.S. PATENT DOCUMENTS

| 6,230,304 | B1 | 5/2001 | Groeneveld et al. | 716/7 |
| 7,669,161 | B2 * | 2/2010 | Lin | 716/55 |
| 2006/0080628 | A1 | 4/2006 | Enomoto et al. | 716/8 |
| 2006/0206845 | A1 | 9/2006 | Rao et al. | 716/6 |
| 2008/0308816 | A1 | 12/2008 | Miller et al. | 257/76 |

OTHER PUBLICATIONS

*PCT Notification of Transmittal of the International Search Report and the Written Opinion of the International Searching Authority* for International Application No. PCT/US2009/040460; 10 pages, Jan. 12, 2010.

* cited by examiner

*Primary Examiner* — Thuan Do
(74) *Attorney, Agent, or Firm* — Baker Botts L.L.P.

(57) ABSTRACT

A method for modeling a circuit includes generating a circuit model based on a netlist that defines a plurality of connections between a plurality of circuit elements. The circuit model includes a model of one or more of the circuit elements. The method further includes determining a wire width associated with at least a selected connection based, at least in part, on design rules associated with the netlist. Additionally, the method includes determining a wire thickness associated with the selected connection based, at least in part, on a signal delay associated with the wire thickness. Furthermore, the method also includes routing the selected connection in the circuit model using a wire having a width substantially equal to the wire width calculated for the connection and a thickness equal to the wire thickness calculated for the connection and storing the circuit model in an electronic storage media.

18 Claims, 6 Drawing Sheets

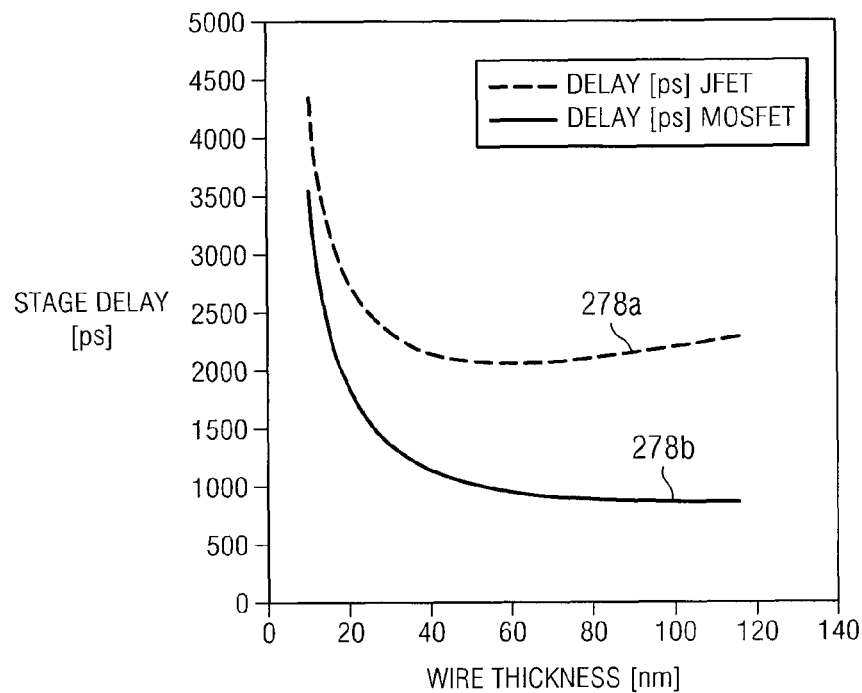
*FIG. 2F*
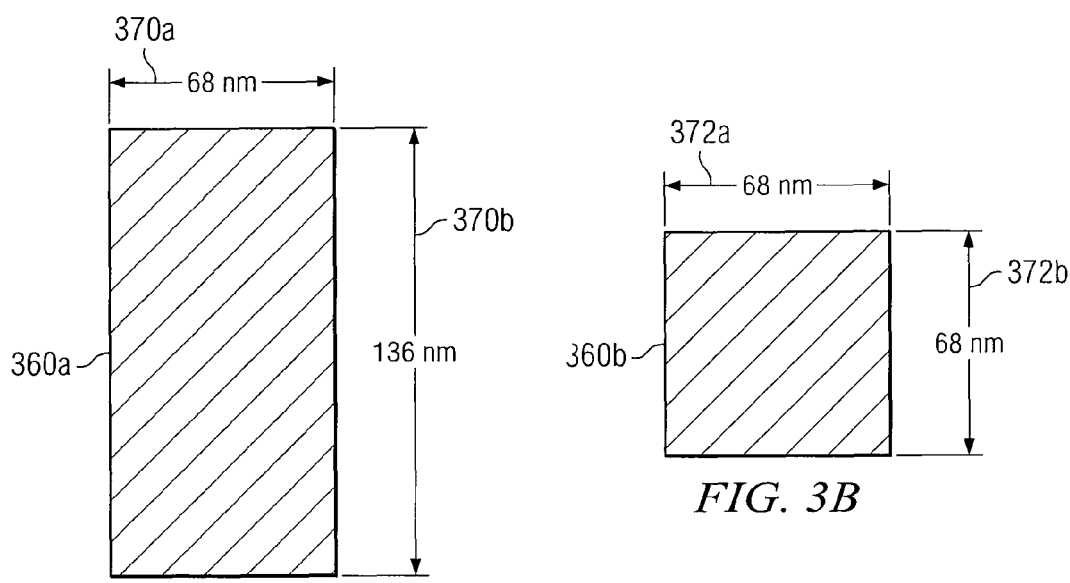
*FIG. 3A*
*FIG. 3B*

SYSTEM AND METHOD FOR ROUTING CONNECTIONS WITH IMPROVED INTERCONNECT THICKNESS

TECHNICAL FIELD OF THE INVENTION

This invention relates, in general, to electronic design automation (EDA) tools for electronic circuits and, more particularly, to tools for improving interconnect elements within electronic circuits.

BACKGROUND OF THE INVENTION

As a result of the rapid technological growth of the past several decades, transistors and other semiconductor devices have become a fundamental building block for a wide range of electronic devices. As the performance demands on these electronic devices increases, there is a need for electronic circuits that are smaller and faster. With transistor performance approaching theoretical limits, minimizing the performance effect caused by interconnect between logic gates becomes an increasingly important aspect of device design.

In many respects, however, the evolution of electronic design automation (EDA) tools has not kept pace with the increases in performance demands. As a result, there is a need for EDA tools and design techniques that provide flexibility in optimizing the properties of electronic circuits to maximize overall device performance In particular, the ability to optimize the location, spacing, and/or dimensions of interconnect within electronic devices has become critical to maximizing performance.

Additionally, as electronic devices have evolved to meet ever-increasing performance demands, many of the assumptions, parameters, and constraints utilized by conventional EDA tools are not applicable to or optimal for designing such devices. For example, recent development efforts have produced semiconductor devices, such as improved junction field effect transistors (JFETs), that provide improved performance under certain circumstances in comparison to the conventional metal-oxide semiconductor field-effect transistors (MOSFETs) that are commonly used in electronic devices. There is thus a need for design methodologies and EDA tools capable of optimizing the design of circuits that incorporate such semiconductor devices.

SUMMARY OF THE INVENTION

In accordance with the present invention, the disadvantages and problems associated with prior semiconductor devices have been substantially reduced or eliminated.

In accordance with one embodiment of the present invention, a method for modeling a circuit includes generating a circuit model based on a netlist that defines a plurality of connections between a plurality of circuit elements. The circuit model includes a model of one or more of the circuit elements. The method further includes determining a wire width associated with at least a selected connection based, at least in part, on design rules associated with the netlist. Additionally, the method includes determining a wire thickness associated with the selected connection based, at least in part, on a signal delay associated with the wire thickness. Furthermore, the method also includes routing the selected connection in the circuit model using a wire having a width substantially equal to the wire width calculated for the connection and a thickness substantially equal to the wire thickness calculated for the connection and storing the circuit model in an electronic storage media.

In accordance with another embodiment of the present invention, a semiconductor product comprises a plurality of circuit elements and a plurality of wires, each wire connecting two or more of the circuit elements. The plurality of circuit elements includes a junction field transistor (JFET) and at least one wire connected to the JFET. The wire connected to the JFET has a wire width associated with a design library for the semiconductor product and a wire thickness selected based on a signal delay associated with the wire thickness.

Technical advantages of certain embodiments of the present invention include increased device performance. Additional technical advantages include the ability to modify existing design tools to improve interconnect sizing and/or minimize signal delay. Other technical advantages of the present invention will be readily apparent to one skilled in the art from the following figures, descriptions, and claims. Additionally, while specific advantages have been enumerated above, various embodiments may include all, some, or none of the enumerated advantages. The following technical advantages may be achieved by some, none, or all of the embodiments of the present invention.

BRIEF DESCRIPTION OF THE DRAWINGS

For a more complete understanding of the present invention and its advantages, reference is now made to the following descriptions, taken in conjunction with the accompanying drawings, in which:

FIGS. 2A-2F illustrate signal delays associated with various different combinations of semiconductor devices and wires;

FIGS. 3A and 3B show examples of how a particular embodiment of the system of FIG. 1 sizes wires under particular circumstances when routing electronic circuits.

DETAILED DESCRIPTION OF THE INVENTION

Figure 1:
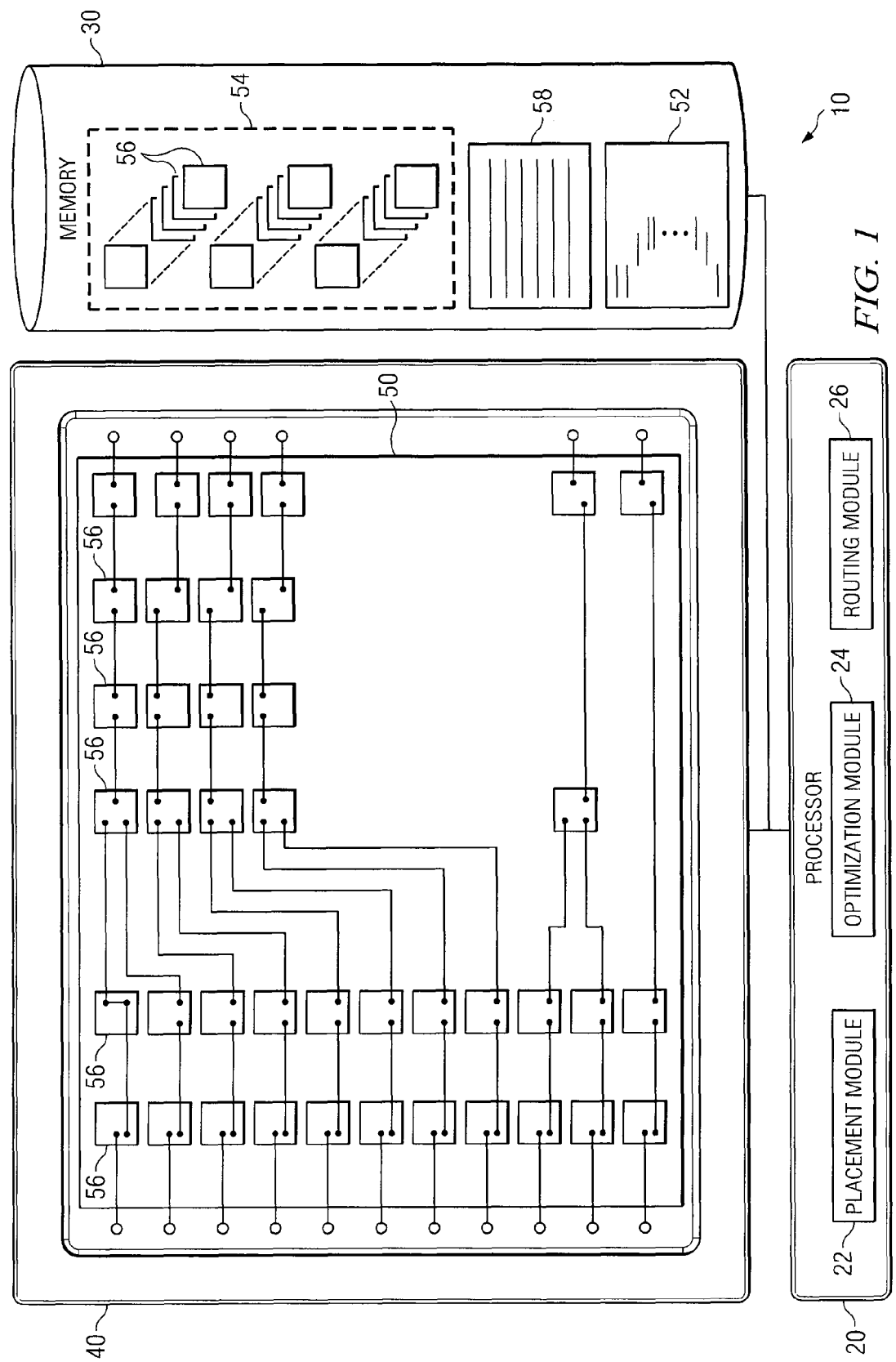
FIG. 1 illustrates a system for designing and modeling electronic circuits with improved performance.

FIG. 1 illustrates a system 10 for designing integrated electronic circuits. In the illustrated embodiment, system 10 includes a processor 20, a memory 30, and a display 40. Additionally, in particular embodiments, system 10 includes a plurality of modules capable of performing certain tasks related to the design, modeling, and/or simulation of electronic circuits, such as a placement module 22, an optimization module 24, and a routing module 26. In particular embodiments, system 10 may improve the performance of electronic circuits designed with system 10 by reducing the signal delay produced by interconnect elements within the electronic circuits.

More specifically, in particular embodiments, the electronic circuits designed by or using system 10 include a plurality of circuit elements that are connected by a collection of wires to facilitate predetermined functionality in the relevant electronic circuit. By modifying the thickness of these wires, as described further below, system 10 may reduce the signal delay introduced in signals propagated on these wires. As a result of this reduction in the relevant signal delays, the operating speed of the electronic circuit may be increased. Furthermore, in particular embodiments, modifying the thickness of these wires may lead to lower overall wire capacitance, which may reduce the dynamic power consumption.

Although the described techniques can be utilized on any appropriately configured design system, FIG. 1 illustrates one embodiment of an example system 10 that can be utilized to design chips having improved wire thickness. As noted above, the illustrated embodiment of system 10 includes processor 20, memory 30, and display 40. Collectively, processor 20, memory 30, and display 40 allow a user of system 10 to create a circuit model 30 modeling an electronic circuit designed by or to be designed by system 10.

Processor 20 may be a general-purpose computer, dedicated microprocessor, or other processing device capable of communicating and processing electronic information. Examples of processor 20 include application-specific integrated circuits (ASICs), field-programmable gate arrays (FPGAs), digital signal processors (DSPs) and any other suitable specific- or general-purpose processors. In particular embodiments, processor 20 operates by executing processor instructions stored in memory 30. Although FIG. 1 illustrates a particular embodiment of system 10 that includes a particular number of processors 20, system 10 may, in general, include any suitable number of processors 10.

Memory 30 stores processor instructions, circuit models 50, netlists 52, cell libraries 54, design rules 58, and/or other values, parameters, and data utilized by system 10 during operation. Memory 30 may comprise any collection and arrangement of volatile or non-volatile, local or remote devices suitable for storing data, such as, for example, random access memory (RAM) devices, read only memory (ROM) devices, magnetic storage devices, optical storage devices, or any other suitable data storage devices. The description below uses the term "memory 30" to refer to any such memory device or memory devices in system 10, coupled to system 10, or otherwise accessible by system 10 or elements of system 10. In particular embodiments, memory 30 may include removable computer readable medium (such as compact discs (CDs), floppy discs, or digital video discs (DVDs)) on which processor instructions to be executed by processor 20 are stored prior to being loaded into a memory element having a fixed connection to system 10.

Display 40 displays circuit model 50, results of simulations involving circuit model 50, and any other appropriate information associated with the electronic circuit corresponding to circuit model 50. In particular embodiments, display 40 may represent a computer monitor or television screen capable of receiving graphics information and/or video signals from processor 20. More generally, however, display 40 may represent any appropriate combination of hardware and/or software capable of displaying information related to circuit model 50 to a user of system 10.

Circuit model 50 represents a model of an electronic circuit. More specifically, circuit model 50 represents any suitable information describing location, operation, and/or composition of the elements within the modeled electronic circuit. The modeled electronic circuit may include any appropriate collection of electronic components, devices, and/or elements. In particular embodiments, circuit model 50 comprises a database object that includes or references a plurality of element models 56 in a circuit being designed by system 10.

Element models 56 each represent a model of an electronic component, device, and/or element that is combined with other circuit elements to provide the functionality of circuits designed by system 10. Element models 56 may model passive elements (such as resistors and capacitors) or active elements (such as transistors). Additionally, in particular embodiments, certain element models 56 may model groups of multiple elements. For example, a particular element model 56 may model a group of transistors that form a logic gate, such as a NAND gate. More generally, each element model 56 may model any appropriate electronic components, device, and/or element or any appropriate group of components, devices, or elements. The description below focuses, for the sake of illustration, on an embodiment in which each element model 56 represents an instance of a particular cell within cell library 54 used to design and simulate circuit model 50. Each cell within cell library 54 represents a model of a particular logic gate, component (such as a transistor, resistor, or capacitor), or other type of electronic element that can be instantiated as appropriate within circuit model 50 to form a circuit having the desired functionality.

In addition, each element model 56 models one or more terminals at which input and output signals are received and transmitted, respectively. These terminals may be logically connected based on the desired functionality and characteristics of the relevant electronic circuit. As discussed further below, system 10 may improve the performance of the modeled circuit by optimizing the sizing (for example, in particular embodiments, the thickness) of these wires.

As shown in FIG. 1, system 10 may also include one or more modules (such as modules 22, 24, and 26) that perform various tasks relating to the design, simulation, or manufacture of electronic circuits. Examples of the functionality provided by such modules in particular embodiments of system 10 include, but are not limited to, logic synthesis, cell placement, routing, clock synthesis, timing and power analysis, and design verification. The specific functionality provided depends on the configuration and capabilities of the particular embodiment of system 10. For example, in the illustrated embodiment, system 10 includes a placement module 22, an optimization module 24, and a routing module 26 that provide functionality as described below. Although the description below focuses, for purposes of illustration, on a particular embodiment of system 10 in which system 10 provides certain design and simulation functionality, system 10 may, more generally, provide any appropriate functionality relating to the design, modeling, and/or simulation of electronic circuits.

Furthermore, modules 22, 24, and 26 may represent physical components within data processing system 10, software processes running on data processing system 10, and/or any other form of computational or processing resources. In particular embodiments, modules 22, 24, and 26 represent software processes executing on processor 20. For example, modules 22, 24, and 26 may each represent a portion of an EDA computer application such as a place-and-route tool and/or software processes spawned by such an application. More generally, however, modules 22, 24, and 26 may each represent or include any collection of software and/or hardware appropriate to provide the described functionality.

In operation, system 10 provides functionality to complete or facilitate completion of certain steps relating to the design, testing, and/or manufacture of electronic circuits. In particular, the illustrated embodiment includes placement module 22, optimization module 24, and routing module 26 that provide specific design functionality. As a result of the operation of placement module 22, optimization module 24, and routing module 26, a user of the illustrated embodiment of system 10 can create a circuit model 50 that can be used for simulation, testing, and/or manufacture of a corresponding circuit. As discussed above and further detailed below, optimization module 24 may, as part of this process, be capable of reducing and/or minimizing signal delay in signals transmitted between circuit elements of the designed circuit by selectively determining the thickness of wires interconnecting the circuit elements.

As part of an example design process, system 10 may receive, generate, or retrieve (e.g., from memory 30) information identifying the contents and relationship between various electronic components of an electronic circuit to be modeled by system 10. For example, placement module 22 may receive information specifying a collection of circuit components in an electronic circuit and generate a corresponding circuit model 50 and a set of connections between the circuit components within circuit model 50. As one specific example, system 10 may receive a netlist 52 that defines a plurality of circuit elements and one or more connections between the defined circuit elements. In particular embodiments, netlist 52 may represent a Very-High-Speed Integrated-Circuit Hardware Description Language (VHDL), Verilog, or other appropriate Hardware Description Language file or files. More generally, however, netlist 52 may represent any appropriate information defining circuit elements included in the electronic circuit and connections between these circuit elements.

System 10 may, based on this information, generate a circuit model 50 that contains or references this information and models the composition and/or operation of the relevant electronic circuit. System 10 may also receive, generate, or retrieve information describing the various components included in the relevant electronic circuit. For example, in particular embodiments, netlist 52 may be associated with a cell library 54 comprising a plurality of element models 56 that each represent a particular logic gate or other circuit element that can be instantiated one or more times within circuit model 50, as needed, to form an accurate model of the relevant electronic circuit.

System 10 may also receive, generate, or retrieve information describing additional requirements or constraints to be satisfied by the electronic circuit to be designed by system 10. For example, system 10 may receive, generate, or retrieve design rules 58 that may include placement and routing constraints, power requirements for the relevant electric circuit, and/or other information to guide the design of the electronic circuit defined by netlist 52. This information may be used by modules 22, 24, and 26 in designing the electronic circuit.

Once system 10 has created, received, or retrieved circuit model 50 and any associated element models 56, placement module 22 may position the element models 56 corresponding to the various circuit elements of the electronic circuit within circuit model 50. Placement modules 22 may select the position for these element models 56 based on connections specified by netlist 52, constraints included in design rules 58, and/or other appropriate information associated with the relevant electronic circuit. Moreover, in particular embodiments, placement module 22 may position the various element models 56 so as to minimize signal delay for some or all of signals transmitted between the various element models 56, reduce interference among these signals, limit clock skew between the corresponding elements, and/or achieve other appropriate objectives.

Furthermore, placement module 22 may, in particular embodiments, perform fully-automated placement of the element models 56 included within circuit model 50. In alternative embodiments, placement module 22 may receive input from a user to allow the user to, in part or in whole, manually position element models 56. In yet alternative embodiments, placement module 22 may place element models 56 based, at least in part, on placement information received from other components or tools. Additionally, in particular embodiments, system 10 may begin operation on circuit model 50 with element models 56 already placed by an external placement tool and no placement may be performed by system 10. Once placement has been completed, placement module 22 (and/or other appropriate elements of system 10) may perform clock tree synthesis, power routing, and/or any other appropriate post-placement operations.

Additionally, after element models 56 have been placed within circuit model 50, optimization module 24 may determine a wire thickness for one or more of the connections identified by netlist 52. Under certain circumstances, the signal delay experienced by signals propagating across a connection of circuit may be determined in part by the thickness of a wire used to form the connection. As a result, optimization module 24 may, under certain circumstances, reduce and/or minimize the signal delay experienced by such signals by determining and/or setting an appropriate wire thickness for these wires.

More specifically, as wire thickness for a given wire decreases, the capacitance of that wire also decreases. Because the signal delay that a particular wire induces in signals has a positive correlation to the capacitance of the wire, the contribution that the wire's capacitance makes to signal delay decreases as the thickness of the wire decreases. Furthermore, in particular embodiments, decreasing the wire thickness may also reduce the chip dynamic power dissipation due to a reduction in the wire's capacitance.

Conversely, as wire thickness for a given wire decreases, the resistance of the wire also increases due to a reduction in wire cross-section area. In addition, as wire thickness decreases, the magnitude of the surface scattering effect induced by the wire increases, which results in wire resistance increasing even further. Because the signal delay that a wire induces in signals propagated on that wire also has a positive correlation to the resistance of the wire, the contribution that the wire's resistance makes to signal delay increases as the thickness of the wire decreases. The net overall effect of these changes in capacitance and resistance may depend, in part, on the characteristics of the wire and the device or devices that the particular wire connects.

For example, recent developments in junction field effect transistors (JFETs) have resulted in the design and fabrication of JFETs capable of out-performing the conventional metal-oxide semiconductor field-effect transistors (MOSFETs) that are commonly used in electronic devices. When logic devices (e.g., a logic gate such as a NAND gate) are formed form these improved JFETs, the logic devices may possess higher output resistance relative to MOSFET logic devices. As a result, the effect of an increase in the resistance of the wires that couple to such JFET logic devices may, up to a point, be dominated by the output resistance of the JFET logic device itself. Thus, wires connected to logic devices that include one or more of these JFETs may cause noticeably smaller signal delays when their thicknesses are reduced.

Below a certain wire thickness, however, the increases in resistance caused by further reductions in wire thickness may become significant despite the large output resistance of the relevant JFET logic device. As a result, further reductions may cause net increases in the signal delay cause by the wire. Thus, with regards to signal delay, an optimal thickness may exist for wires connected to JFET devices in a circuit such as that modeled by circuit model 30. FIGS. 2A-2F illustrate the optimal thickness for example wires based on various different factors.

As a result, optimization module 24 may, in particular embodiments, determine and/or set a wire thickness for one or more wires that will form the connections defined by netlist 52. In particular embodiments, optimization module 24 may determine a wire thickness for one or more wires by accessing or receiving predetermined wire thickness values (e.g., in design rules 58) associated with circuit model 30 that have been calculated to minimize or reduce the signal delays associated with the relevant wires and providing these wire thickness values to routing module 26 for use in routing the connections. As a result, in particular embodiments, optimization module 24 may represent a portion of routing module 26.

Alternatively, in particular embodiments, optimization module 24 may itself calculate optimal wire thicknesses for one or more of the wires that will form the connections defined by netlist 52. Various factors may affect the signal delay induced by a particular wire modeled in circuit model 30, and optimization module 24 may optimize wire thickness of that wire with respect to any or all of these factors. Moreover, in embodiments in which optimization calculates a wire thickness for one or more wires, optimization module 24 may calculate such thicknesses in any appropriate manner based on any appropriate considerations, factors, and/or characteristics of the corresponding wires and the electronic elements that these wires connect.

As one example, many types of MOSFETs that are commonly used in electronic devices do not possess output resistances as large as those provided by the JFETs described above. As a result, the negative effects of increased wire resistance may offset the positive effects of decreased capacitance at a greater thickness for wires connected to MOSFETs than for wires connected to JFETs. Consequently, in particular embodiments, optimization models may select or calculate a wire thickness for one or more connections of circuit model 30 based on a device type associated with those connections. As one example, optimization module 24 may select a first wire thickness for connections associated with output terminals of JFET logic devices in circuit model 50 and a second wire thickness for connections associated with output terminals of MOSFET logic devices, with the second wire thickness being greater than the first wire thickness. In particular embodiments, optimization module 24 may utilize a wire thickness of between 60 nanometers (nm) and 70 nm connections associated with output terminals of JFET devices and a wire thickness of greater than 80 nm for wires associated with output terminals of MOSFET devices.

As another example, wire length may affect the wire thickness at which signal delay is minimized. In particular, the signal delay in longer wires is more sensitive to changes in resistance. As a result, a minimum signal delay occurs for longer wires at a greater thickness than for shorter wires and then further thickness reductions begin to have a net negative impact on signal delay. Thus, particular embodiments of optimization module 24 may select and/or calculate a wire thickness for wires based on a wire length associated with the wires. For example, in particular embodiments, optimization module 24 may use a smaller wire thickness on shorter wires than is used on longer wires.

As yet another example, in particular embodiments, optimization module 24 may reduce the complexity of routing by calculating and/or setting a wire thickness for wires based on an average, maximum, and/or minimum optimal value associated with groups of wire modeled by circuit model 30 instead of determining optimal values for each wire. For example, in particular embodiments, optimization may calculate wire thicknesses for a group of wires (e.g., all wires routed on a second metal layer of circuit design 50) based on an average wire length associated with the group of wires. As another example, in particular embodiments, optimization module 24 may determine that more of the wires modeled by circuit model 30 will be connected to JFET devices than MOSFET devices in circuit model 50 and, as a result, determine a thickness for all wires modeled by circuit model 50 based on an optimal wire thickness for JFET devices. More generally, however, optimization module 24 may calculate and/or set a thickness for these wires based on any appropriate consideration suing any suitable techniques.

Additionally, in particular embodiments, fabrication technology limits may prevent use of the optimal wire thickness when fabricating a circuit based on the relevant circuit model 50 or may make use of the optimal wire thickness too costly, too difficult, or otherwise undesirable. As a result, in particular embodiments, optimization module 24 may select a wire thickness for a particular wire associated with a particular type of electronic element that is greater than the optimal wire thickness for the corresponding wire but less than a default wire thickness associated with the corresponding wire and/or a wire thickness used for other device types.

For example, in particular embodiments, system 10 may utilize wires having a 1-to-2 aspect ratio (width versus thickness) for connecting MOSFET components in circuit model 50. Optimization module 24 may, however, reduce the thickness of wires connecting JFET components. Under certain fabrication technologies for which system 100 may design circuits, however, an aspect ratio of less than 1-to-1 for wires may be incredibly difficult and/or expensive to attain. Nonetheless, using a 1-to-1 ratio may, in particular embodiments, still result in signal delay reductions for wires associated with JFET components even if the optimal thickness for those wires would be substantially less than their width. As a result, in particular embodiments, optimization module 24 may select, calculate, or otherwise determine a wire thickness that does not produce the least signal delay but that provides reduced signal delay by comparison to a default thickness associated with circuit model 50.

After optimization module 24 has calculated, selected, or otherwise determined one or more wire thicknesses for the connections identified by circuit model 30, routing module 26 (or other appropriate components of system 10) may route the various nets connecting the element models 56 of circuit model 50. As part of routing these connections, system 10 may generate a model of a wire (represented graphically in display 40 by any of wire models 60) connecting specific terminals of the relevant element models 56 and add these wire models 60 to circuit model 50.

Wire models 60 each represent a model of an interconnect element capable of connecting elements models 56 to one another and other elements of circuit model 50. Wire models 60 may include and/or be associated with various characteristics of a wire capable of forming the modeled connection in a circuit corresponding to circuit model 50. For example, in particular embodiments, wire model 60 may include or be associated with dimensions (e.g., length, width, and thickness), connectivity information, metal type, topography information, resistance, capacitance, and/or any other appropriate data suitable to allow circuit model 50 to accurately model the interconnect connecting element models 56 of circuit model 50.

In particular embodiments, system 10 routes the identified connections based on design rules 58 associated with circuit model 50 and/or cell library 54. Design rules 58 may define spacing requirements, layer restrictions, object sizes, and/or other constraint that system 10 considers when routing the identified connections. Additionally, system 10 may route the identified connections based on determinations or calculations performed by optimization module 24. For example, in particular embodiments, routing module routes wires using a minimum width associated with design rules 58 and a wire thickness determined by optimization module 24.

After routing circuit model 50, system 10 may store the routed version of circuit model 50, including placed element models 56 and wire models 60, in memory 30. In particular embodiments, the routed circuit model 50 may then be output for use in the fabrication of a circuit corresponding to circuit model 50 or analyzed and revised to address other design issues before being used in production. In particular embodiments, the electronic circuit resulting from such fabrication will utilize wires having wire thicknesses chosen to reduce and/or minimize signal delay induced in signal traversing those wires.

As a result of the described techniques, the signals traveling on wires within the circuit corresponding to circuit model 50 may experience less signal delay than these signals would experience if the relevant wires were sized with conventional wire thicknesses. Consequently, in particular embodiments, the fabricated circuit model 50 may operate at higher speeds. Furthermore, in particular embodiments, this decreased wire thickness may lead to lower overall wire capacitance, which may reduce the dynamic power consumption in the relevant wires. Thus, particular embodiments of system 10 may provide numerous benefits. Nonetheless, certain embodiments may provide some, none, or all of these benefits.

Although the description above focuses on an embodiment of system 10 in which optimization module 24 performs optimization automatically, in particular embodiments of system 10, a user may manually instruct system 10 to perform some or all of the optimization steps. As a result in such embodiments, optimization module 24 may represent, in part or in whole, the user interface and/or file access components that allow the user to adjust wire thickness settings before routing, to reduce the wire thickness after routing, and/or to perform other tasks related to reducing wire thickness.

FIGS. 2A-2F illustrate the effect of wire thickness on signal delay for example embodiments of a JFET logic gate and a MOSFET logic gate. In particular, FIGS. 2B-2F show the signal delay induced in various different lengths of wire 260 when connected in two different embodiments of circuit 200 (circuits 200a and 200b) shown in FIG. 2A. These two embodiments include one embodiment in which NAND gates 202 (in the case of circuit 200a, NAND gates 202a-c) are formed from JFETs and another in which NAND gates 202 (in the case of circuit 200b, NAND gate 202d-f) are formed from MOSFETs. The signal delay for each embodiment was measured by hspice simulations of a 68 nm wide wire 260 connected between NAND gate 202a and NAND gates 202b and 202c for circuit 200a and between NAND gate 202d and NAND gates 202e and 202f for circuit 200b.

Figure 2A:
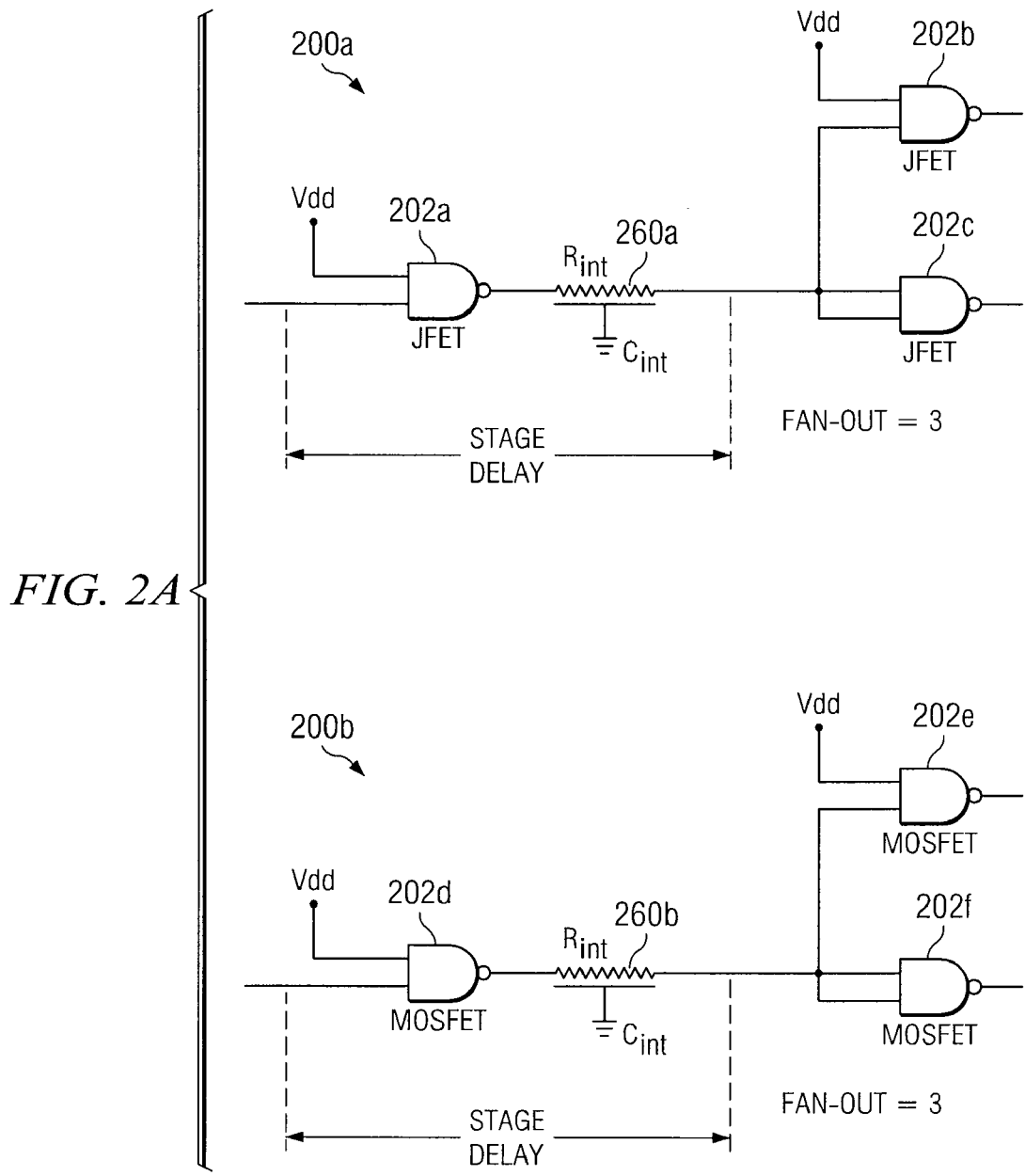
Figure 2B:
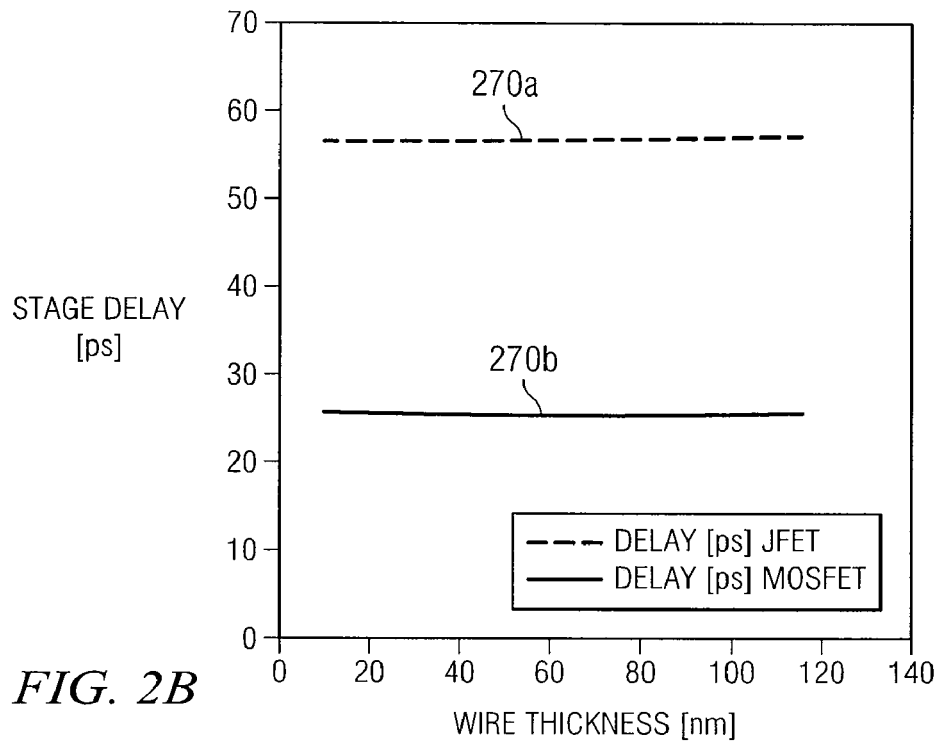

In particular, FIG. 2B illustrates the signal delay for the JFET embodiment of example circuit 200 (shown by curve 270a) and the MOSFET embodiment of example circuit 200 (shown by curve 270b) of circuit 200 when wire 260 has a length of 1.14 micrometers (μm). As shown, in FIG. 2B the signal delays for both the example JFET embodiment and the example MOSFET embodiment are relatively indifferent to changes in thickness for this wire length. As a result, for this wire length, optimizing the wire thickness for wire 260 may provide little to no improvement in the signal delay associated with wire 260.

Figure 2C:
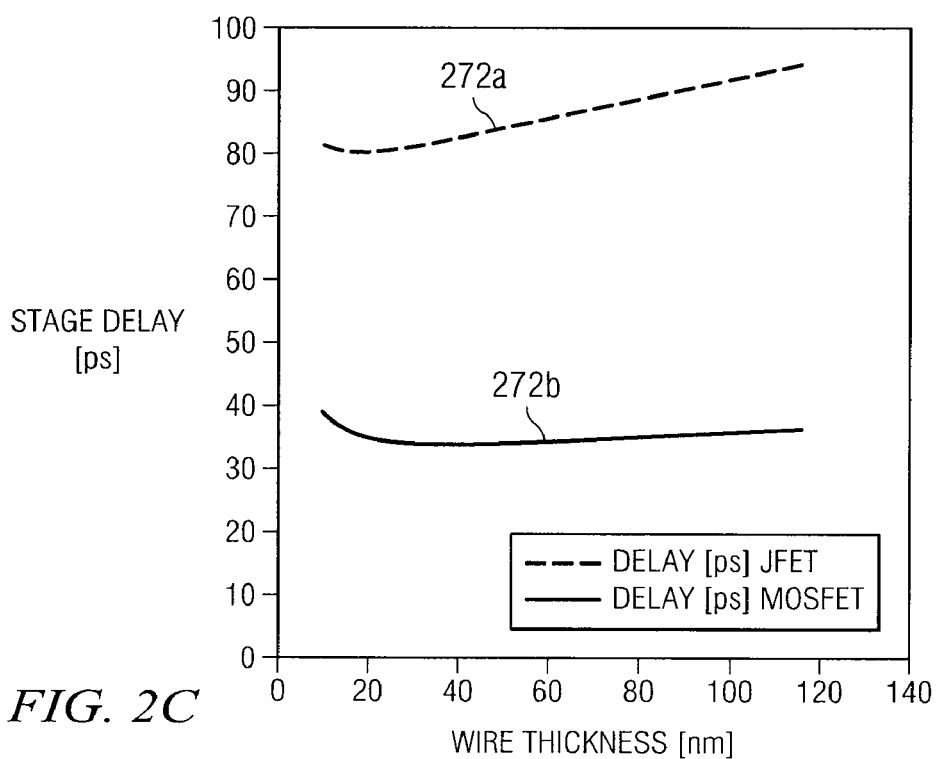

FIG. 2C illustrates the signal delay for the JFET embodiment (shown by curve 272a) and the MOSFET embodiment (shown by curve 272b) of circuit 200 when wire 260 has a length of 19.7 μm. As shown in FIG. 2C, the signal delays for both the example JFET embodiment and the example MOSFET embodiment for this wire length show a more noticeable response to changes in wire thickness. As FIG. 2C indicates, optimizing the wire thickness for wire 260 may reduce the signal delay induced by wire 260 to a minimum, both in the JFET embodiment and the MOSFET embodiment. This point at which the minimum occurs, however, is different for the two embodiments. Specifically, the minimum signal delay occurs at a thinner wire thickness for the JFET embodiment than it does for the MOSFET embodiment.

Figure 2D:
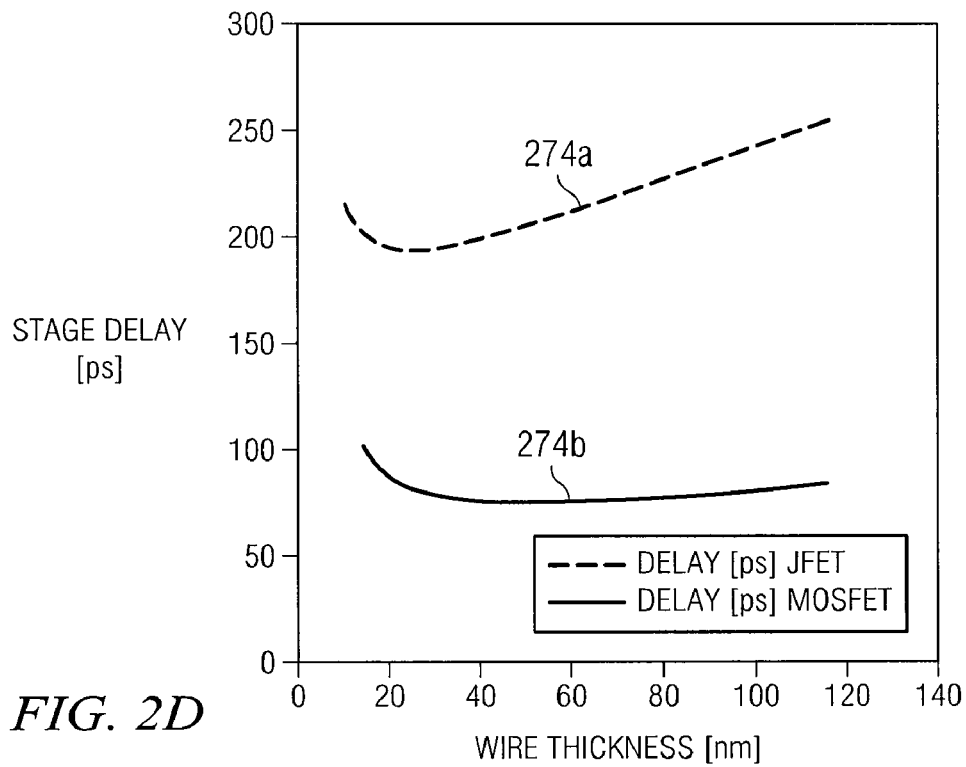

FIG. 2D illustrates the signal delay for the JFET embodiment (shown by curve 274a) and the MOSFET embodiment (shown by curve 274b) of circuit 200 when wire 260 has a length of 102 μm. As in FIG. 2C, the signal delays illustrated in FIG. 2D, for both the example JFET embodiment and the example MOSFET embodiment, show a more noticeable response to changes in wire thickness than shown in FIG. 2B. As FIG. 2D indicates, optimizing the wire thickness for wire 260 may once again reduce the signal delay induced by wire 260 to a minimum, both in the JFET embodiment and the MOSFET embodiment. As in FIG. 2C, the point at which the minimum occurs however is again different for the two embodiments. Specifically, the minimum signal delay occurs at a thinner wire thickness for the JFET embodiment than it does for the MOSFET embodiment. Moreover, both minimums occur for a greater thickness than for the shorter wire length described by FIG. 2C.

Figure 2E:
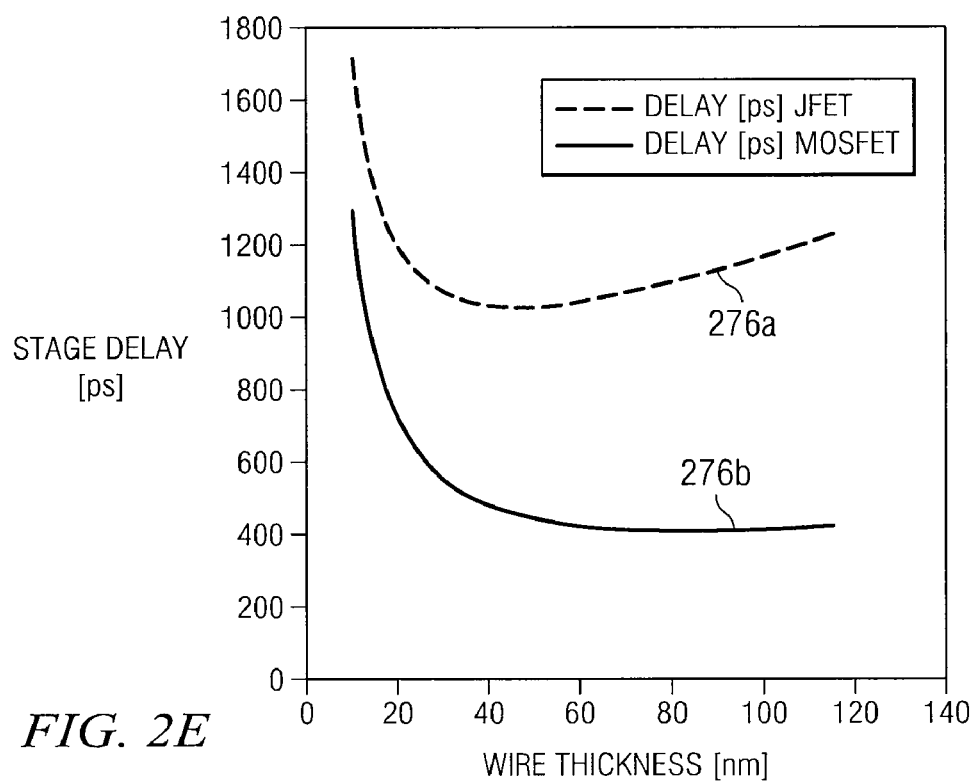

FIG. 2E illustrates the signal delay for the JFET embodiment (shown by curve 276a) and the MOSFET embodiment (shown by curve 276b) of circuit 200 when wire 260 has a length of 557 μm. By comparison to FIGS. 2C and 2D, the signal delays for both the example JFET embodiment and the example MOSFET embodiment for this wire length show an even more noticeable response to changes in wire thickness. As FIG. 2E indicates, a local minimum exists for the signal delay both in the JFET embodiment and the MOSFET embodiment. This point again occurs at a thinner thickness for the JFET embodiment than the MOSFET embodiment. Moreover, both minimums occur for a greater thickness than for the shorter wire lengths described by FIGS. 2C and 2D.

FIG. 2F illustrates the signal delay for the JFET embodiment (shown by curve 278a) and the MOSFET embodiment (shown by curve 278b) of circuit 200 when wire 260 has a length of 1000 μm. Once again, by comparison to FIGS. 2C-2E, the signal delays for both the example JFET embodiment and the example MOSFET embodiment for this wire length show an even more noticeable response to changes in wire thickness. As FIG. 2F indicates, a local minimum again exists for the signal delay both in the JFET embodiment and the MOSFET embodiment. This point again occurs at a thinner thickness for the JFET embodiment than the MOSFET embodiment. Moreover, both minimums occur for a greater thickness than for the shorter wire lengths described by FIGS. 2C-2E.

Thus, as can be seen by FIGS. 2A-2E, particular embodiments of system 10 may be able to reduce and/or optimize the signal delay associated with a particular wire 260 by determining an appropriate thickness for the relevant wire 260 based, at least in part, on a length of the wire 260, the devices connected by the wire 260, and/or other suitable factors.

FIGS. 3A and 3B show examples of how the system of FIG. 1 may size wires under particular circumstances when routing electronic circuits. In particular, FIGS. 3A and 3B illustrate example wire dimensions used by particular embodiments of system 10 to size wires.

More specifically, FIG. 3A illustrates a wire 360a having a typical width and thickness for conventional circuits that primarily utilize MOSFET devices. In the illustrated example, the 68 nm width (shown by arrow 370a) is defined by design rules associated with the relevant circuit. Wire 360b has a thickness typically used in MOSFET circuits, 136 nm (shown by arrow 370b). As can be seen by FIG. 3A, MOSFET devices often utilize wires having a 1-to-2 aspect ratio (width versus thickness).

FIG. 3B illustrates a cross section of a wire 360b that has been optimized for use with JFET devices under appropriate conditions. In the illustrated example, the 68 nm width (shown by arrow 372a) is again defined by design rules associated with the relevant circuit. Wire 360b has an improved thickness (shown by arrow 372b) that exhibits better performance when used with certain types and configurations of JFET devices. For many JFET circuits, an aspect using wires having a 1-to-1 aspect ratio (width versus thickness), as shown in FIG. 3B, may show reduced signal delay. For example, wire 360b shown in FIG. 3B has a thickness of 68 nm which is equal to its width. Although FIG. 3B illustrates a wire 360b having particular dimensions and aspect ratio, particular embodiments of system 10 may design circuits to utilize wires 360b having an improved thickness with any suitable dimensions and aspect ratio.

Figure 4:
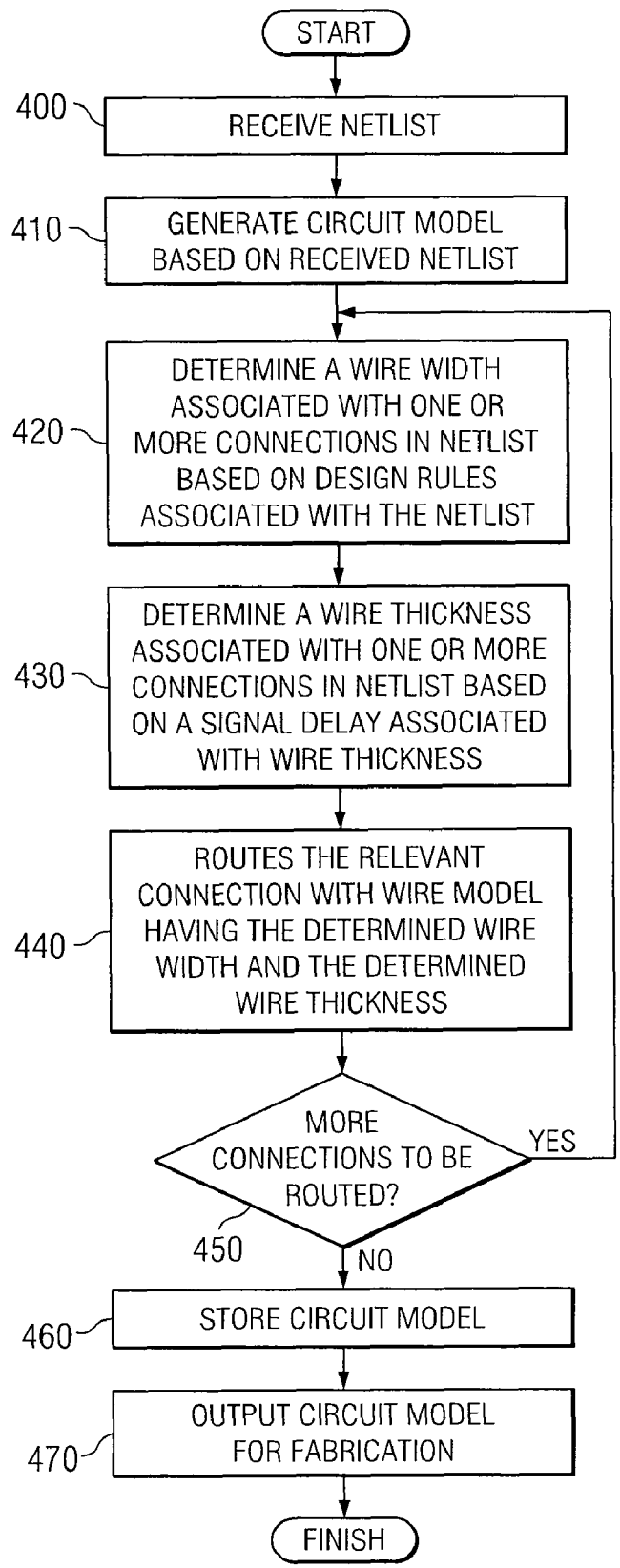
FIG. 4 is a flowchart illustrating an example method for creating a model of an electronic circuit with improved performance.

FIG. 4 is a flowchart illustrating an example operation of system 10. In particular, FIG. 4 illustrates the operation of system 10 generating circuits and/or circuit models having improved interconnect thickness. The steps illustrated in FIG. 4 may be combined, modified, or deleted where appropriate. Additional steps may also be added to the example operation. Furthermore, the described steps may be performed in any suitable order.

Operation of the described embodiment of system 10 begins at step 400 with system 10 receiving netlist 52 associated with an electronic circuit to be designed using system 10. In particular embodiments, netlist 52 describes or identifies a plurality of circuit elements that make up the electronic circuit and defines a plurality of connections between these circuit elements. Additionally, in particular embodiments, netlist 52 is associated with one or more design rules 58 that define technological constraints, target characteristics, and/or other requirements or properties for the circuit to be designed.

In particular embodiments, system 10 may generate a circuit model 50 based on the received netlist 52 at step 410. As part of generating circuit model 30, placement module 22 may place element models 56 corresponding to the circuit elements in netlist 52 within circuit model 50. As discussed above, element models 56 may be placed based on netlist 52, cell library 54, design rules 58, and/or other appropriate information associated with the relevant electronic circuit. Moreover, in particular embodiments, system 10 may select locations for the various element models 56 so as to minimize delay for some or all of signals transmitted between the various element models 56, to reduce interference among these signals, to limit clock skew between the corresponding elements, and/or to achieve other appropriate objectives.

At step 420, optimization module 24, routing module 26, and/or other appropriate elements of system 10 determine a wire width associated with one or more connections in netlist 52 based, at least in part, on the design rules associated with the netlist 52. This wire width may be defined by design rules 58, calculated based on certain design goals or restrictions, or otherwise retrieved, selected, and/or determined by the appropriate element of system 10 in any other suitable manner. System 10 may then store this information for use by routing module 26 when routing circuit model 30.

At step 430, optimization module 24 determines a wire thickness associated with one or more connections of netlist 52. As noted above, optimization module 24 may determine the appropriate thickness for the relevant connection based, at least in part, on a signal delay associated with the determined wire thickness. Moreover, optimization module 24 may consider any appropriate aspect of the associated signal delay in determining the appropriate wire thickness.

As one example, in particular embodiments, optimization module 24 may determine a wire thickness for a particular connection based at least on a device type associated with the connection. In particular embodiments, optimization module 24 may identify a device type associated with the connection. For example, in particular embodiments, optimization module 24 may be configured to determine a device type associated with the connection. For connections associated with JFET devices, optimization module 24 may determine a first wire thickness while, for connections associated with MOSFET devices, optimization module 24 may determine a second wire thickness that is greater than the first wire thickness.

As another example, optimization module 24 may determine a wire thickness for a particular connection based, at least in part, on a minimum wire thickness associated with design rules 58 and/or a fabrication technology associated with netlist 52 or circuit model 30. As noted above, limitations of a particular fabrication technology may prevent optimization module 24 from utilizing the optimal wire thickness for a particular connection, but optimization module 24 may still reduce delay nonetheless by using a reduced wire thickness that is within certain constraints associated with the relevant design rules 58 or fabrication technology. For example, in particular embodiments, limitations of a particular fabrication technology may make wire thicknesses of less than the minimum wire width for that particular technology difficult or impossible to achieve. As a result, in particular embodiments, optimization module 24 may determine the wire thickness for a particular connection based on a minimum wire thickness associated with the relevant technology (e.g., equal to the minimum wire width) regardless of whether the lowest signal delay is achieved at thickness point below this minimum wire thickness.

As yet another example, a particular connection may be one of several connections to be routed by system 100, and optimization module 24 may utilize a common thickness for multiple different connections defined by netlist 52. For example, optimization module 24 may determine an average optimal thickness, a maximum optimal thickness, a minimum optimal thickness, or a thickness that otherwise optimizes signal delay for one or more connections within netlist 52 and may apply this thickness to multiple connections defined by netlist 52 regardless of whether the relevant thickness optimizes signal delay for an individual connection. This may allow optimization module 24 to improve overall signal delay within circuit model 30 but with only limited increases in computational complexity.

Additionally, as noted above, optimization module 24 may determine the appropriate wire thickness by reading the relevant thickness from data stored by system 100, receiving information specifying the appropriate thickness from a user of system 100, and/or by performing appropriate calculations and/or operations to determine the appropriate thickness. Furthermore, optimization module 24 may determine the appropriate wire thickness during design of the relevant circuit model 30, before receiving netlist 52, and/or at any other appropriate time.

After optimization module 24 determines an appropriate wire thickness for a connection, routing module 26 routes the relevant connection with a wire 60 at step 440. The wire 60 that routing module 26 uses to route the connection has a width equal to the determined wire width and a thickness equal to the determined wire. System 10 may repeat this process for all connections in netlist 52 as shown in FIG. 4 at step 450.

System 10 may then store circuit model 50, including all wires 60, in electronic media at step 460. At step 470, system 10 may output circuit model 50 in a suitable format for electronic circuits to be fabricated based on circuit model 50. The operation of system 10 with respect to designing and modeling the relevant electronic circuit may then end as shown in FIG. 4. After circuit model 50 is output by system 10, electronic circuits may be fabricated based on circuit model 50.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for modeling a circuit, comprising:
receiving, at a computing machine, a netlist that defines a plurality of connections between a plurality of circuit elements, wherein the netlist is associated with one or more design rules;
generating, by the computing machine, a circuit model based on the netlist, wherein the circuit model comprises a model of one or more of the circuit elements;
determining, by the computing machine, a wire width associated with at least a selected connection based, at least in part, on the design rules associated with the netlist;
determining, by the computing machine, a wire thickness associated with the selected connection based, at least in part, on a signal delay associated with the wire thickness;
routing, by the computing machine, the selected connection in the circuit model based on the wire width associated with the connection and the wire thickness associated with the connection; and
storing, by the computing machine, the circuit model in an electronic storage media;
wherein at least one of the circuit elements comprises a junction field effect transistor (JFET) logic device that includes a JFET operable to turn on when a voltage differential of 0.5 volts is applied across a gate terminal and a source terminal of the JFET.

2. The method of claim 1, wherein the wire thickness associated with the selected connection is approximately equal to the wire width associated with the connection.

3. The method of claim 1, wherein the wire thickness associated with the selected connection is within a range from approximately 60 nanometers to approximately 70 nanometers.

4. The method of claim 1, wherein determining a wire thickness associated with a minimal delay comprises determining a wire thickness within a range of approximately 60 nanometers to 70 nanometers.

5. The method of claim 1, further comprising:
calculating a wire length associated with at least a selected one of the plurality of connections; and
wherein determining a wire thickness comprises determining a wire thickness associated with a minimal signal delay for the calculated wire length.

6. The method of claim 5, wherein:
calculating the wire length comprises calculating an average wire length associated with two or more of the connections;
determining the wire width comprises determining a wire width associated with the connections based, at least in part, on the design rules associated with the netlist;
determining the wire thickness comprises determining the wire thickness associated with a minimum signal delay for the calculated average wire length; and
routing the selected connection comprises routing the connections in the circuit model based on the wire width associated with the connections and the wire thickness associated with the minimum signal delay for the calculated average wire length.

7. The method of claim 1, wherein the circuit elements comprise at least one circuit element of a first device type and at least one circuit element of a second device type, and wherein determining a wire thickness associated with the selected connection comprises:
identifying a device type of an output device associated with the selected connection; and
determining a wire thickness based on the device type of the output device.

8. The method of claim 7, wherein the circuit element of the first device type comprises a junction field effect transistor (JFET) logic device and the circuit element of the second device type comprises a metal-oxide semiconductor field effect transistor (MOSFET) logic device.

9. The method of claim 8, wherein determining a wire thickness based on the device type of the output device comprises:
determining a wire thickness equal to a first wire thickness if the output device comprises a JFET logic device; and
determining a wire thickness equal to a second wire thickness if the output device comprises a MOSFET logic device, wherein the second wire thickness is greater than the first wire thickness.

10. A non-transitory computer-readable storage medium including code for modeling a circuit, the code operable when execute to:
receive a netlist that defines a plurality of connections between a plurality of circuit elements, wherein the netlist is associated with one or more design rules;
generate a circuit model based on the netlist, wherein the circuit model comprises a model of one or more of the circuit elements;
determine a wire width associated with at least a selected connection based, at least in part, on the design rules associated with the netlist;
determine a wire thickness associated with the selected connection based, at least in part, on a signal delay associated with the wire thickness;
route the selected connection in the circuit model based on the wire width associated with the connection and the wire thickness associated with the connection; and
store the circuit model in an electronic storage media;
wherein at least one of the circuit elements comprises a junction field effect transistor (JFET) logic device that includes a JFET operable to turn on when a voltage differential of 0.5 volts is applied across a gate terminal and a source terminal of the JFET.

11. The computer software product of claim 10, wherein the wire thickness associated with the selected connection is approximately equal to the wire width associated with the connection.

12. The computer software product of claim 10, wherein the wire thickness associated with the selected connection is approximately equal to a minimum wire thickness associated with the circuit.

13. The computer software product of claim 10, wherein the computer instructions are operable to determine a wire thickness associated with a minimal delay by determining a wire thickness within a range of approximately 60 nanometers to 70 nanometers.

14. The computer software product of claim 10, wherein the computer instructions are further operable to calculate a wire length associated with at least a selected one of the plurality of connections; and wherein the computer instructions are operable to determine a wire thickness by determining a wire thickness associated with a minimal signal delay for the calculated wire length.

15. The computer software product of claim 14, wherein the computer instructions are operable to:
   calculate a wire length by calculating an average wire length associated with two or more of the connections;
   determine the wire width by determining a wire width associated with the connections based, at least in part, on the design rules associated with the netlist;
   determine the wire thickness by determining the wire thickness associated with a minimum signal delay for the calculated average wire length; and
   route the selected connection by routing the connections in the circuit model based on the wire width associated with the connections and the wire thickness associated with the minimum signal delay for the calculated average wire length.

16. The computer software product of claim 10, wherein the circuit elements comprise at least one circuit element of a first device type and at least one circuit element of a second device type, and wherein the processor instructions are operable to determine a wire thickness associated with the selected connection by:
   identifying a device type of an output device associated with the selected connection; and
   determining a wire thickness based on the device type of the output device.

17. The computer software product of claim 16, wherein the circuit element of the first device type comprises a junction field effect transistor (JFET) logic device and the circuit element of the second device type comprises a metal-oxide semiconductor field effect transistor (MOSFET) logic device.

18. The computer software product of claim 17, wherein the processor instructions are further operable to determine a wire thickness based on the device type of the output device by:
   determining a wire thickness equal to a first wire thickness if the output device comprises a JFET logic device; and
   determining a wire thickness equal to a second wire thickness if the output device comprises a MOSFET logic device, wherein the second wire thickness is greater than the first wire thickness.

* * * * *